US009627353B2

(12) United States Patent
Kelly et al.

(10) Patent No.: US 9,627,353 B2
(45) Date of Patent: Apr. 18, 2017

(54) METHOD OF MANUFACTURING A SEMICONDUCTOR PACKAGE

(71) Applicant: Amkor Technology, Inc., Tempe, AZ (US)

(72) Inventors: Michael G. Kelly, Queen Creek, AZ (US); David Jon Hiner, Chandler, AZ (US); Ji Hun Lee, Seoul (KR); Won Chul Do, Bucheon-Si (KR); Doo Hyun Park, Gyeonggi-Do (KR); Ronald Huemoeller, Gilbert, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 15/240,534

(22) Filed: Aug. 18, 2016

(65) Prior Publication Data

US 2017/0005070 A1    Jan. 5, 2017

Related U.S. Application Data

(63) Continuation of application No. 14/159,237, filed on Jan. 20, 2014, now Pat. No. 9,437,575.

(51) Int. Cl.
*H01L 23/00* (2006.01)
*H01L 21/56* (2006.01)
(Continued)

(52) U.S. Cl.
CPC ............ *H01L 24/97* (2013.01); *H01L 21/486* (2013.01); *H01L 21/4853* (2013.01); *H01L 21/563* (2013.01); *H01L 21/565* (2013.01); *H01L 21/78* (2013.01); *H01L 23/3135* (2013.01); *H01L 23/49816* (2013.01); *H01L 23/49827* (2013.01); *H01L 23/49838* (2013.01);
(Continued)

(58) Field of Classification Search
CPC ... H01L 24/97; H01L 21/4853; H01L 21/486; H01L 21/565; H01L 21/78
See application file for complete search history.

(56) References Cited

U.S. PATENT DOCUMENTS

| 9,437,575 B1 | 9/2016 | Kelly et al. | |
| 2011/0101512 A1* | 5/2011 | Choi | H01L 24/29 257/686 |

(Continued)

*Primary Examiner* — Errol Fernandes
(74) *Attorney, Agent, or Firm* — McAndrews, Held & Malloy, Ltd.

(57) ABSTRACT

Methods for a semiconductor device package formed in a chip-on-wafer last process using thin film adhesives are disclosed and may include bonding a first carrier to a first surface of an interposer in wafer form, forming conductive bumps on a second surface of the interposer, bonding a second carrier to the conductive bumps utilizing a film adhesive, removing the first carrier from the interposer, bonding a semiconductor die to the first surface of the interposer, and encapsulating the die and the first surface of the interposer in an encapsulant material. The second carrier and the film adhesive may be removed from the conductive bumps utilizing a slide-off process. The interposer and encapsulant may be diced into a plurality of interposer and die structures. One of the die and interposer structures may be bonded to a substrate. The die may be bonded to the interposer utilizing a mass reflow process.

20 Claims, 14 Drawing Sheets

(51) Int. Cl.
  *H01L 21/48* (2006.01)
  *H01L 21/78* (2006.01)
  *H01L 23/498* (2006.01)
  *H01L 23/31* (2006.01)
  *H01L 25/065* (2006.01)
  *H01L 25/00* (2006.01)

(52) U.S. Cl.
  CPC .......... *H01L 24/16* (2013.01); *H01L 25/0655* (2013.01); *H01L 25/50* (2013.01); *H01L 2224/16227* (2013.01)

(56) References Cited

U.S. PATENT DOCUMENTS

| | | | |
|---|---|---|---|
| 2012/0086122 A1* | 4/2012 | Cheng | H01L 24/05 257/738 |
| 2012/0238057 A1 | 9/2012 | Hu et al. | |
| 2013/0270682 A1* | 10/2013 | Hu | H01L 23/5389 257/666 |
| 2014/0131876 A1* | 5/2014 | Hua | H01L 21/76898 257/762 |
| 2014/0134803 A1 | 5/2014 | Kelly et al. | |

* cited by examiner

METHOD OF MANUFACTURING A SEMICONDUCTOR PACKAGE

CROSS-REFERENCE TO RELATED APPLICATIONS/INCORPORATION BY REFERENCE

The present application is a continuation of U.S. application Ser. No. 14/159,237, titled "Semiconductor Device Package Formed in a Chip-on-Wafer Last Process Using Thin Film Adhesive", filed Jan. 20, 2014, now U.S. Pat. No. 9,437,575. The above-mentioned application is hereby incorporated herein by reference in its entirety.

FIELD

Certain embodiments of the disclosure relate to semiconductor chip packaging. More specifically, certain embodiments of the disclosure relate to a method and system for a semiconductor device package formed in a chip-on-wafer last process using thin film adhesives.

BACKGROUND

Semiconductor packaging protects integrated circuits, or chips, from physical damage and external stresses. In addition, it can provide a thermal conductance path to efficiently remove heat generated in a chip, and also provide electrical connections to other components such as printed circuit boards, for example. Materials used for semiconductor packaging typically comprises ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present disclosure as set forth in the remainder of the present application with reference to the drawings.

DETAILED DESCRIPTION

Certain aspects of the disclosure may be found in a semiconductor device package formed in a chip-on-wafer last process using thin film adhesives. Example aspects of the disclosure may comprise bonding a first carrier to a first surface of an interposer in wafer form, forming conductive bumps on a second surface of the interposer, bonding a second carrier to the conductive bumps utilizing a film adhesive, removing the first carrier from the interposer, bonding one or more semiconductor die to the first surface of the interposer, and encapsulating the one or more semiconductor die and the first surface of the interposer in an encapsulant material. The second carrier and the film adhesive may be removed from the conductive bumps utilizing a slide-off process. The interposer and encapsulant may be diced into a plurality of interposer and die structures. One of the plurality of die and interposer structures may be bonded to a substrate. The one or more semiconductor die may be bonded to the interposer utilizing a mass reflow process. A capillary underfill material may be utilized in the mass reflow process. The one of the plurality of die and interposer structures may be bonded to the substrate utilizing the conductive bumps formed on the second surface of the interposer. The one of the plurality of die and interposer structures may be bonded to the substrate utilizing a mass reflow process on the conductive bumps formed on the second surface of the interposer. Through-silicon-vias (TSVs) may be exposed at the second surface of the interposer before forming the conductive bumps on the second surface of the interposer. The encapsulant material may be ground down to expose a surface of the one or more semiconductor die. The conductive bumps may comprise copper and the encapsulant material may comprise a polymer.

Figure 1:
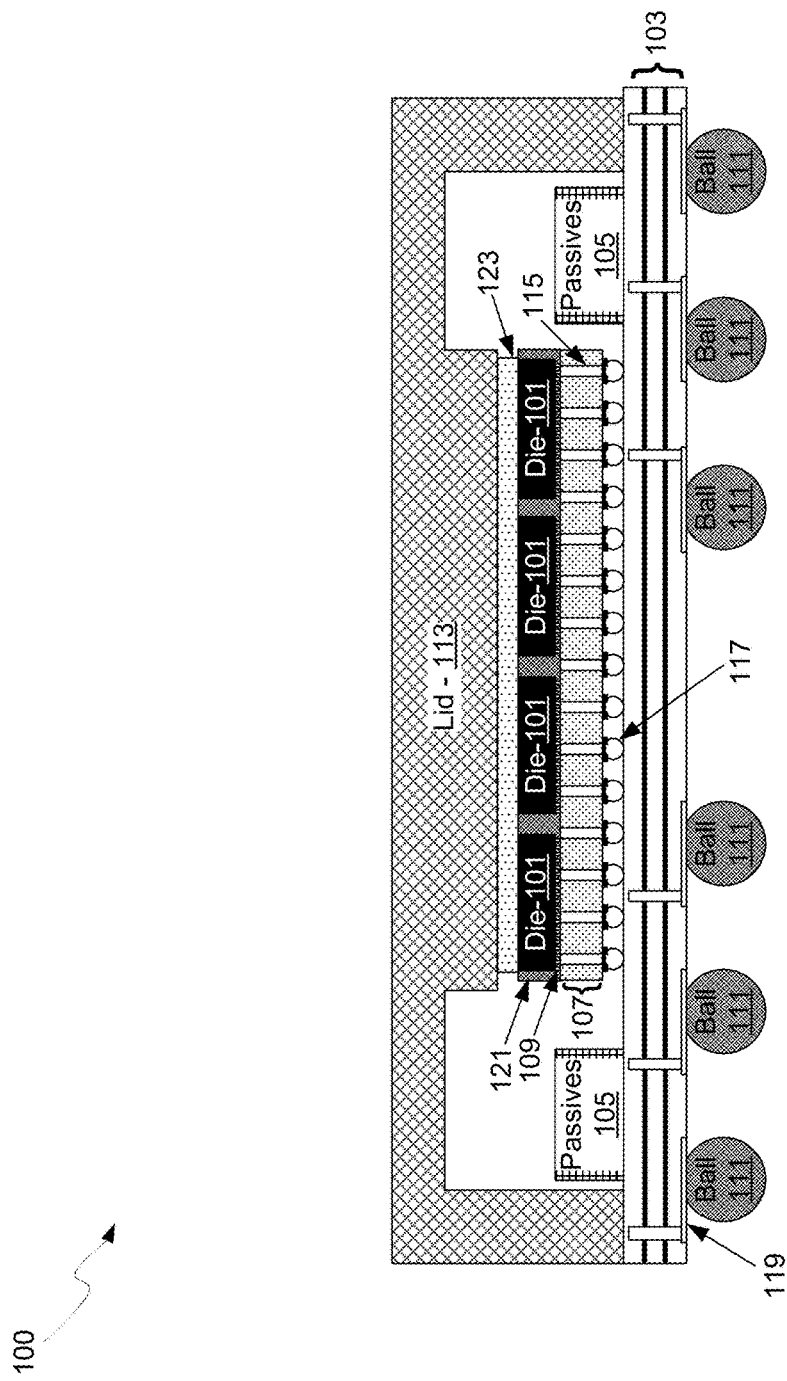
FIG. 1 is a schematic illustrating an integrated circuit package configured with a chip-on-wafer last process using thin film adhesives, in accordance with an example embodiment of the disclosure.

FIG. 1 is a schematic illustrating an integrated circuit package configured with a chip-on-wafer last process using thin film adhesives, in accordance with an example embodiment of the disclosure. Referring to FIG. 1, there is shown a package 100 comprising die 101, a packaging substrate 103, passive devices 105, an interposer 107, solder balls 111, a lid 113, mold compound 121, and thermal interface material 123.

The die 101 may comprise integrated circuit die that have been separated from one or more semiconductor wafers. The die 101 may comprise electrical circuitry such as digital signal processors (DSPs), network processors, power management units, audio processors, RF circuitry, wireless baseband system-on-chip (SoC) processors, sensors, memory, and application specific integrated circuits, for example. In addition, the die 101 may comprise micro-bumps 109 for providing electrical contact between the circuitry in the die 101 and contact pads on the surface of the interposer 107.

The interposer 107 may comprise a semiconductor substrate separated from a wafer, such as a silicon wafer, with through-silicon-vias (TSVs) 115 that provide electrically conductive paths from one surface of the interposer 107 to the opposite surface. The interposer 107 may also comprise backside bumps 117 for making electrical and mechanical contact to the packaging substrate 103. In another example scenario, the interposer 107 may comprise glass or an organic laminate material, either of which may be capable of large panel formats on the order of 500×500 mm, for example.

The packaging substrate 103 may comprise a mechanical support structure for the interposer 107, the die 101, the passive devices 105, and the lid 113. The packaging substrate 103 may comprise solder balls 111 on the bottom surface for providing electrical contact to external devices and circuits, for example. The packaging substrate 103 may also comprise conductive traces in a non-conductive material for providing conductive paths from the solder balls to the die 101 via pads that are configured to receive the backside bumps 117 on the interposer 107. Additionally, the packaging substrate 103 may comprise pads 119 for receiving the solder balls 111. The pads 119 may comprise one or more under-bump metals, for example, for providing a proper electrical and mechanical contact between the packaging substrate 103 and the solder balls 111.

The passive devices 105 may comprise electrical devices such as resistors, capacitors, and inductors, for example, which may provide functionality to devices and circuits in the die 101. The passive devices 105 may comprise devices that may be difficult to integrate in the integrated circuits in the die 101, such as high value capacitors or inductors. In another example scenario, the passive devices 105 may comprise one or more crystal oscillators for providing one or more clock signals to the die 101.

The lid 113 may provide a hermetic seal for the devices within the cavity defined by the lid 113 and the packaging substrate 103. A thermal interface may be created for heat transfer out of the die 101 to the lid 113 via the thermal interface material 123, which may also act as an adhesive.

In an example scenario, the package 100 may be fabricated utilizing a chip-on-wafer (CoW) last process that uses a pre-applied film to affix an interposer wafer with C4 bumps to a wafer carrier for subsequent wafer processing. The type of bonding enables a slide off debond of the first carrier and room temperature debond of the second carrier. In a CoW last process, the interposer backside may be processed before the top die attach step, thereby enabling a reflow attachment of the top die to a full-thickness interposer wafer. Processing with a full-thickness interposer may improve yields because processing of thinned wafers may suffer from planarity issues. The bonded die may be encapsulated in a mold compound with the structure then being planarized to expose the top die.

An assembly comprising the die 101 and the interposer wafer may be singulated and the singulated assembly may then be bonded to the packaging substrate 103 utilizing either mass reflow or thermal compression. The lid 113 may be placed on the bonded assembly to provide a hermetic seal and protect the circuitry from the external environment. Finally, electrical tests may be performed following the bonding processes to verify that proper electrical connections were made and no shorts or open circuits exist.

Figures 2A, 2B:
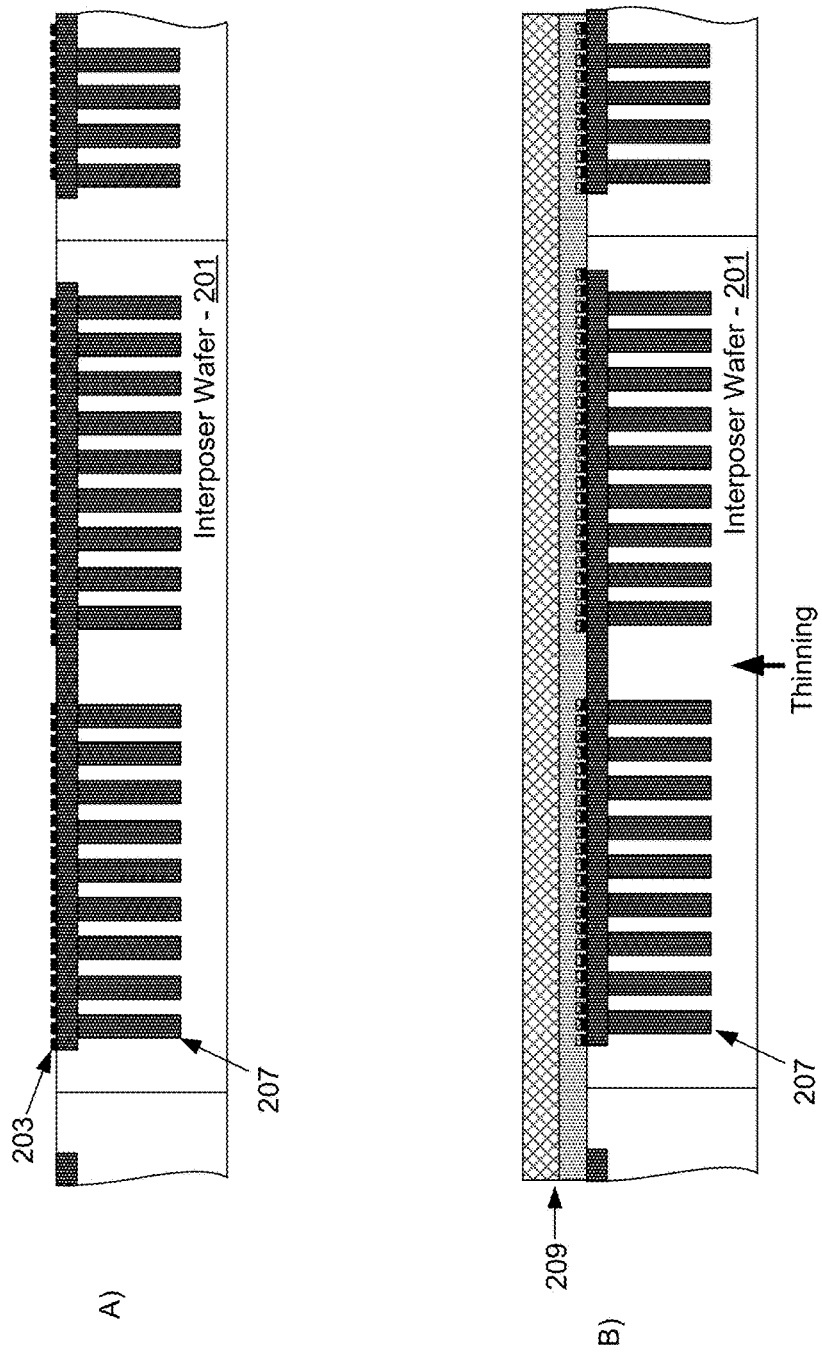
FIGS. 2A-2G illustrate a chip-on-wafer last fabrication process, in accordance with an example embodiment of the disclosure.
Figures 2C, 2D:
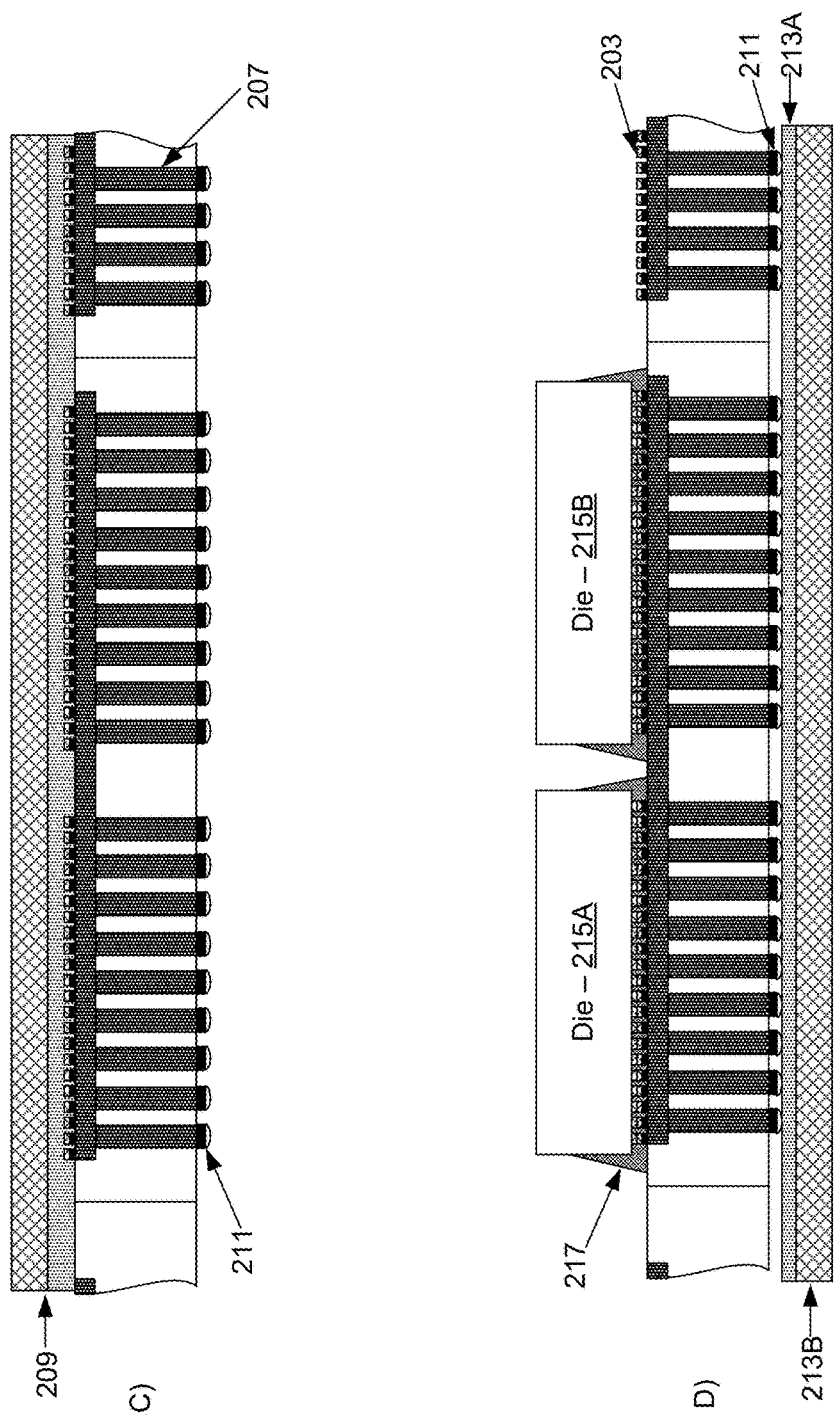

FIGS. 2A-2F illustrate a chip-on-wafer last fabrication process, in accordance with an example embodiment of the disclosure. Referring to FIG. 2A, there is shown an interposer wafer 201 that may comprise a plurality of individual interposer die, each of which may be coupled to one or more semiconductor die, such as the die 215A and 215B shown in FIG. 2D. The interposer wafer 201 may also comprise front side pads 203 for providing electrical contact to semiconductor die, such as the die 215A and 215B. Furthermore, the interposer wafer 201 may comprise through-silicon-vias (TSVs) 207 for providing electrically conductive paths from one surface of the interposer to the other, once the interposer wafer 201 has been thinned enough to expose the TSVs 207, as shown in FIGS. 2B and 2C. FIG. 2B. shows the interposer wafer 201 bonded to a carrier 209, which may comprise an adhesive layer and a rigid support structure.

Conductive bumps 211 may be formed on the exposed TSVs, as shown in FIG. 2C, and may comprise copper, for example. A second carrier comprising a film adhesive 213A and a rigid support structure 213B may be bonded to the conductive bumps 211 and the first carrier 209 may be removed. In an example scenario, the conductive bumps 211 may be partially or wholly embedded in the film adhesive 213A as opposed to be fully outside the film adhesive 213A, as shown in FIG. 2D. The semiconductor die 215A and 215B may be bonded to the front-side pads 203, with a capillary underfill material 217 filling the void between the die and the interposer, as well as a portion of the side surfaces of the die 215A and 215B, as illustrated in FIG. 2D. The die 215A-215C may be bonded using a mass reflow bonding technique, for example. In another example scenario, a thermal compression process may be utilized to bond the die 215A-215C. A non-conductive paste (NCP) may also be utilized to assist in forming the bonds.

FIG. 2D illustrates the die 215A-215C bonded to the interposer wafer 201 with underfill material 217. When deposited or placed, the underfill material 217 may comprise a film, paste, b-stage film, or a liquid, for example. Electrical tests may be performed on the processed interposer 201 so that only good sites may receive semiconductor die, which may provide substantial cost savings when utilizing costly semiconductor die.

Figures 2E, 2F:
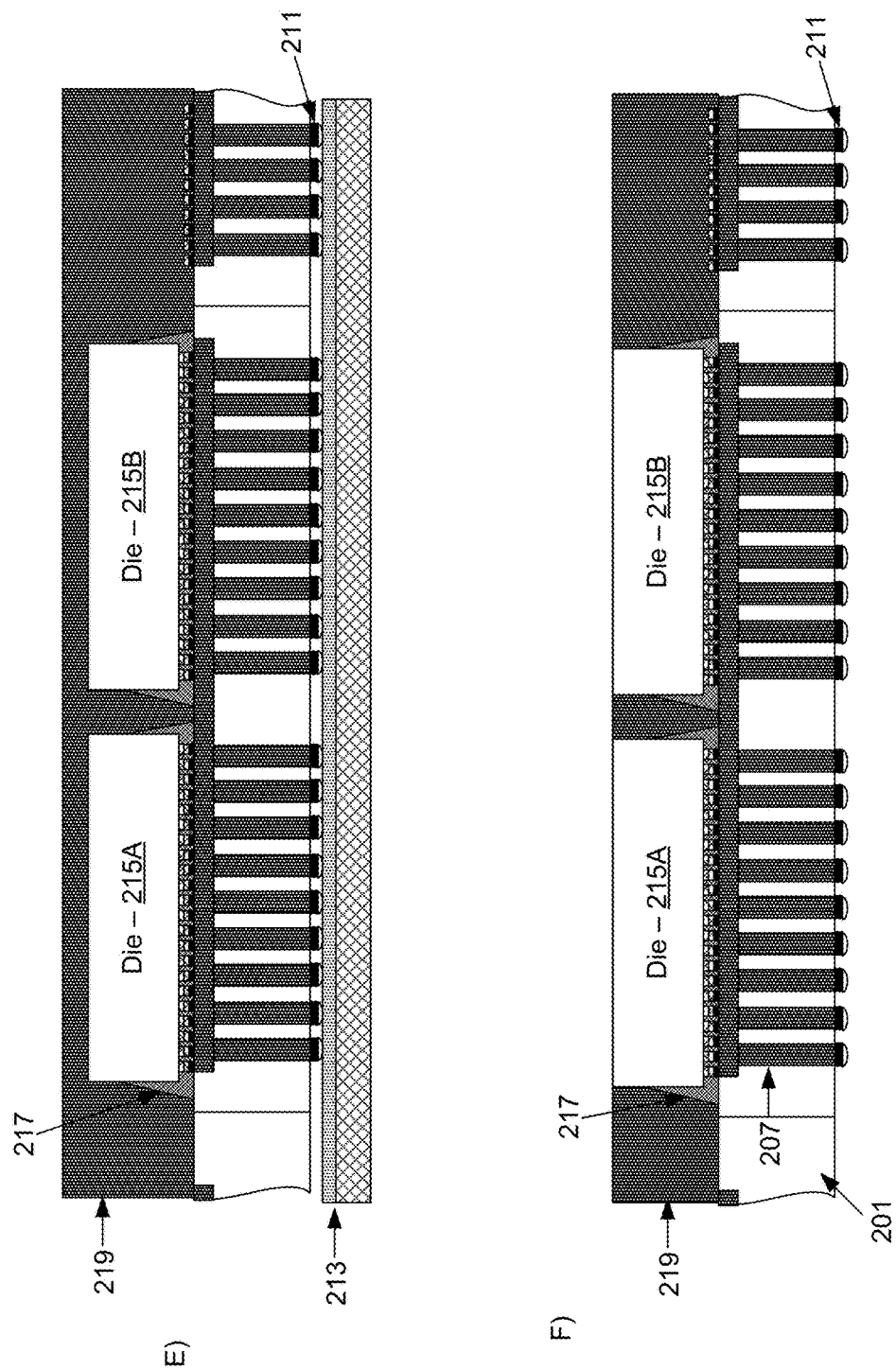

The space above the interposer wafer 201 and between the die 215A-215B may be filled with a mold material 219, as illustrated in FIG. 2E. The mold material 219 may comprise a polymer material, for example, that may provide a non-conductive structural support for die bonded to the interposer wafer 201, protecting the die in subsequent processing steps and when diced into individual packages. In another example scenario, the mold material 219 may be formed on the interposer wafer 201 at a later stage in the processing, such as when the interposer/die structure may be singulated and bonded to a substrate. In yet another example scenario, the mold process may be eliminated completely, resulting in a no-mold structure.

While the underfill material 217 is shown in FIGS. 2D-2G, the mold material 219 itself may be utilized as underfill material for each coupling interface, such as between the die 215A and 215B and the interposer wafer 201. In another example embodiment, underfill material may be inserted as a liquid or paste, placed as a film, or a b-staged film and may be placed sequentially as each die to substrate or die to die bond is made, or may be made all at one time after all the electrical bonds are made.

The film adhesive 213 may be removed utilizing a slide-off method. Because the film adhesive 213 does not envelop the conductive bumps 211 as conventional adhesives do, a mass reflow process may be utilized to bond the semiconductor die 215A and 215B to the interposer 201 as opposed to a thermal compression process, for example.

The molded assembly may then be singulated utilizing a cutting technology such as reactive ion etching, plasma etching (e.g. an inductively coupled plasma), laser cutting, or mechanical saw. In an example scenario, the molded assembly may be partially cut and then separated with a mechanical pulling apart of the die.

Figure 2G:
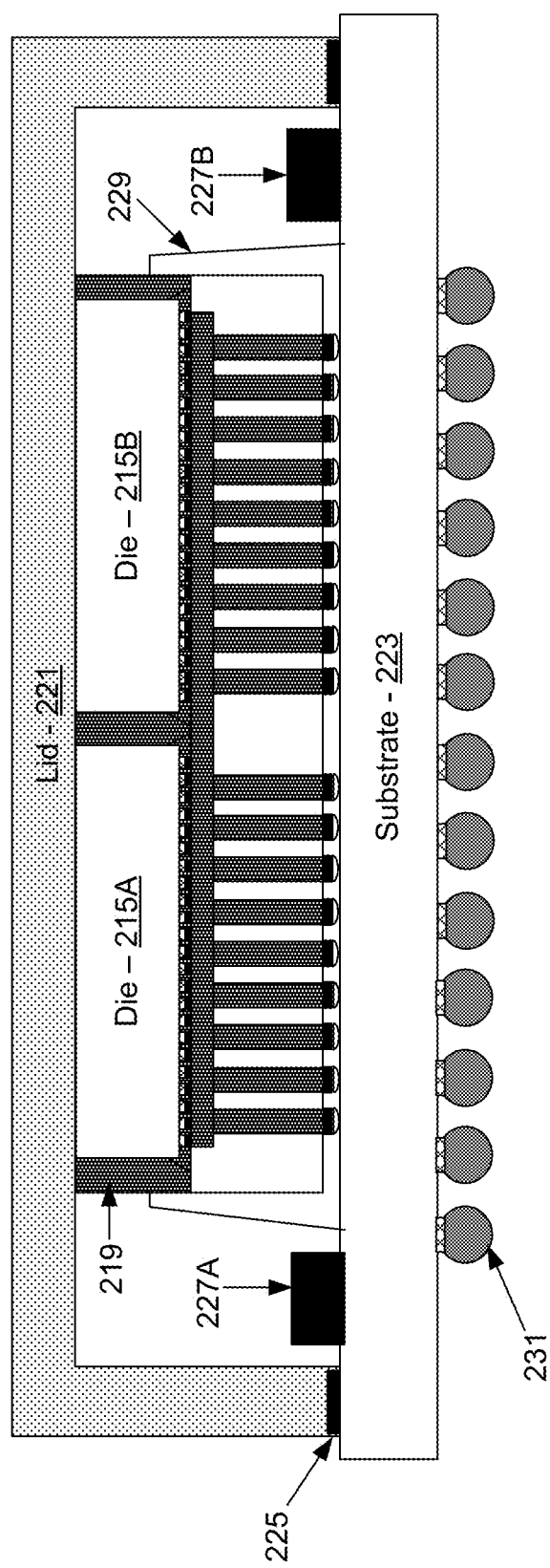

The singulated molded die/interposer assembly comprising the die 215A-215B and the interposer wafer 201 may then be bonded to the packaging substrate 223 via the conductive bumps 211, as illustrated in FIG. 2G. The packaging substrate 223 may comprise contact pads (not shown) for making contact with the conductive bumps 211, and also on the bottom surface for placement of solder balls 231 as shown in FIG. 2G. Another capillary underfill material 229 may be placed between the interposer 201 and the substrate 223, similar to the underfill material 217.

In addition, the lid 221 may be placed on the package assembly with a hermetic seal made with an adhesive 225 at the surface of the packaging substrate 223, which may also comprise a thermal interface material. Accordingly, the lid 221 may make contact with the top surfaces of the die 215A and 215B for thermal heat sinking purposes (e.g., directly or via a terminal interface material). The solder balls 231 may comprise metal spheres for making electrical and mechanical contact with a printed circuit board, for example.

Figures 3A, 3B, 3C, 3D:
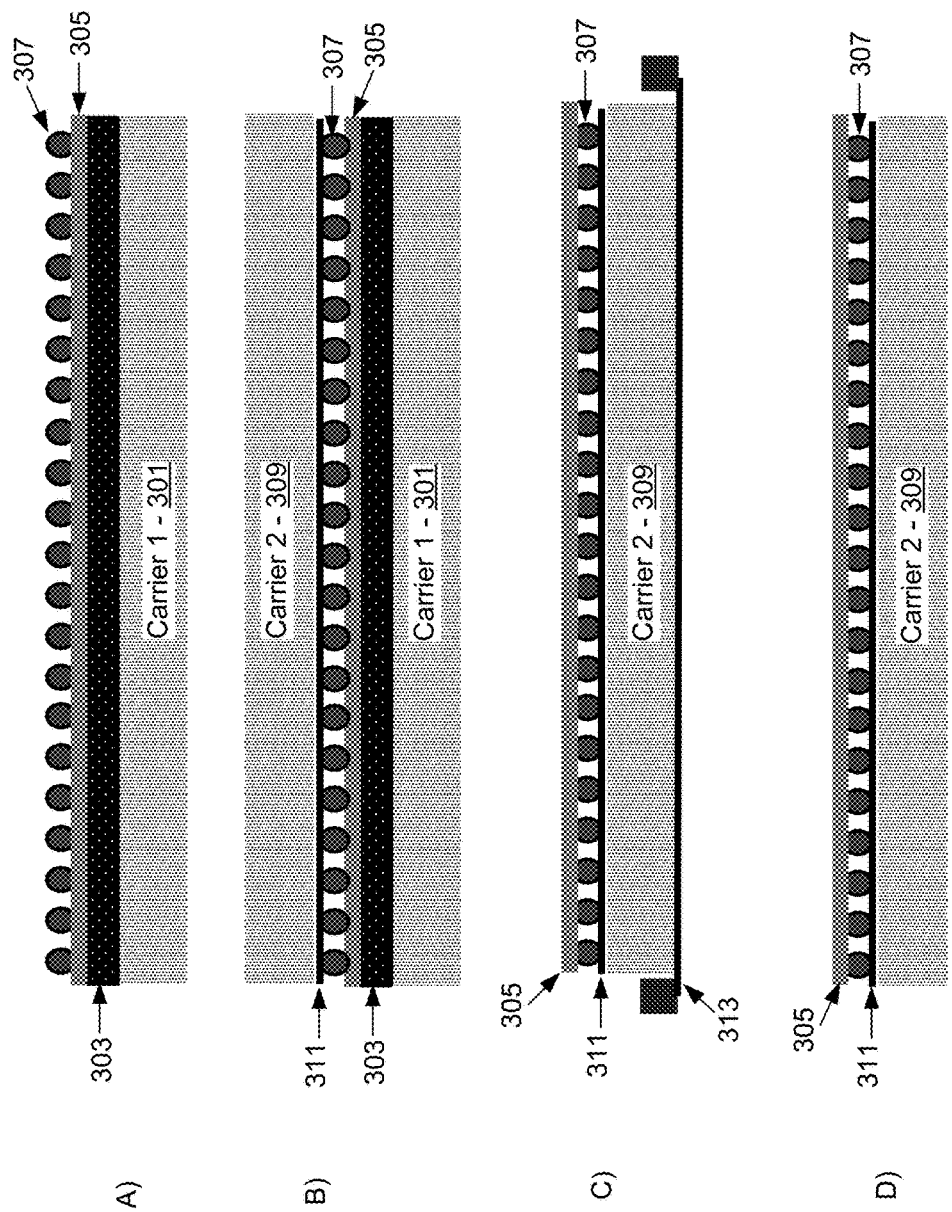
FIGS. 3A-3J illustrate interposer wafer processing with a film adhesive attached carrier, in accordance with an example embodiment of the disclosure.

FIGS. 3A-3J illustrate interposer wafer processing with a film adhesive attached carrier, in accordance with an example embodiment of the disclosure. Referring to FIG. 3A, there is shown a first carrier 301, an adhesive layer 303, an interposer 305, and conductive bumps 307. The carrier 301 may comprise a support structure for handling of the interposer 305, such as when placing the conductive bumps 307 on the interposer 305.

The interposer 305 may comprise a wafer of individual interposer die, and may be coupled to the first carrier 301 using the adhesive layer 303. The first carrier 301 may be utilized to support the interposer 305 while forming the conductive bumps 307 and other backside processing steps. In an example scenario, the conductive bumps 307 may comprise copper C4 solder bumps.

FIG. 3B illustrates the attachment of a second carrier 309 to the conductive bumps 307 utilizing the film adhesive 311, which may comprise a thin sheet of adhesive material that may bond to the conductive bumps 307 without enveloping them, nor filling the voids between bumps. Thus, the removal of the film adhesive 311 may be easier than conventional adhesive layers so that lower cost slide-off methods may be utilized. In an another example scenario, the conductive bumps 307 may be partially or wholly embedded in the film adhesive 311 as opposed to be fully outside the film adhesive 311, as shown in FIG. 3B. In addition, subsequent processing with the thick interposer wafer may provide good planarity for bonding of die, particularly with larger devices.

FIG. 3C illustrates the removal of the first carrier 301 utilizing the tape carrier 313, which may provide a temporary lateral support structure for handling the interposer 305 during a "slide-off" process for removing the first carrier 301. The second carrier 309, the film adhesive 311, the conductive bumps 307, and the interposer 305 may then be de-taped, i.e. removed from the tape carrier 313, resulting in the structure shown in FIG. 3D.

Figures 3E, 3F, 3G, 3H, 3I, 3J:
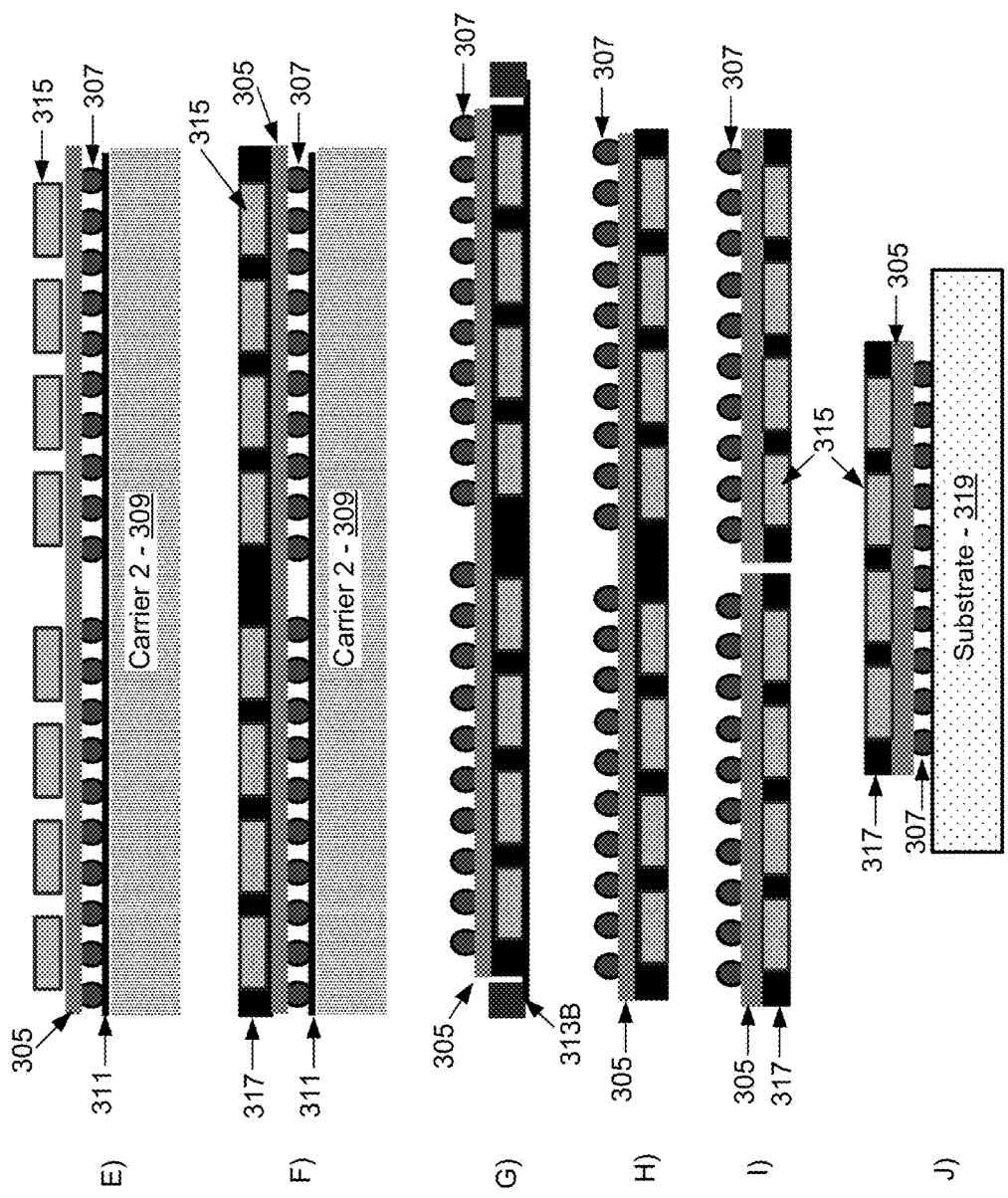

The interposer 305 may then be processed for the bonding of the semiconductor die 315. This may comprise forming conductive bumps, such as the conductive bumps 211 shown in FIG. 2. In another example scenario, the conductive bumps may already be formed on the interposer 305, to which the semiconductor die 315 may be bonded, as shown in FIG. 3E.

The semiconductor die 315 may be bonded to the interposer 305 utilizing a mass reflow process, for example, and may also utilize a capillary underfill material to fill the void between the die and the interposer.

Because the film adhesive 311 does not envelop the conductive bumps 307 as conventional adhesives do, the mass reflow process may be utilized to bond the semiconductor die 315 to the interposer 305 as opposed to a thermal compression process, for example.

The semiconductor die 315 and the top of the interposer 305 may then be encapsulated by an encapsulant 317, which may comprise an epoxy-based material, for example, that provides electrical isolation and mechanical protection from external stresses and conditions. The encapsulant 317 may cover the top surface of the semiconductor die 315, or may be ground down to expose the top surface of the die. The structure in FIG. 3F illustrates encapsulant material slightly covering the top surface of the semiconductor die 315.

The second carrier 309 may then be removed utilizing a slide-off process using the tape carrier 313B, which may stabilize the interposer 305 while removing the second carrier 309 and the film adhesive 311, resulting in the structure shown in FIG. 3H.

The interposer 305 with semiconductor die 315 and encapsulant 317 may then be singulated into a plurality of packaged die, as shown in FIG. 3I. The singulation may proceed by a mechanical sawing process, for example, where each singulated package may then be bonded to a substrate 319, as illustrated in FIG. 3J. The conductive bumps 307 may be electrically coupled to contact pads on the substrate 319 utilizing a mass reflow process, for example. Accordingly, a capillary underfill may be used to fill the void between the interposer 305 and the substrate 319.

In another example scenario, the encapsulation process shown in FIG. 3F may be skipped, with the structure processed similarly to the final step shown in FIG. 3J but without the encapsulant. The resulting structure may then be encapsulated, if desired, following electrical testing of the interconnections made and the function on the semiconductor die 315. In this manner, the structure may be tested prior to encapsulation, which may be particularly useful when higher cost die are utilized. In yet another example scenario, the mold process may be eliminated completely, resulting in a no-mold structure.

Figures 4A, 4B, 4C, 4D, 4E:
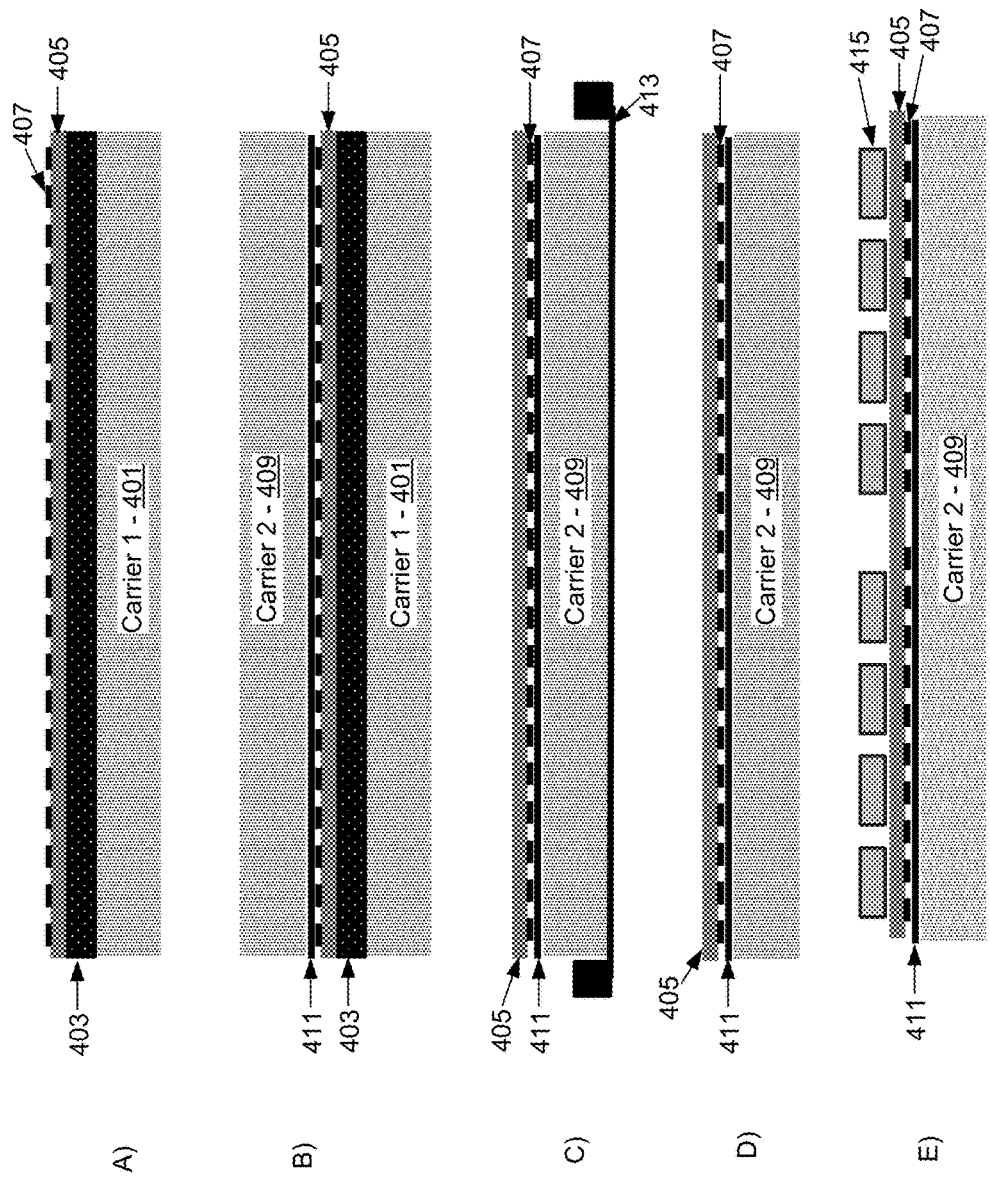
FIGS. 4A-4K illustrate interposer wafer processing with under-bump metal and a film adhesive attached carrier, in accordance with an example embodiment of the disclosure.

FIGS. 4A-4K illustrate interposer wafer processing with under-bump metal and a film adhesive attached carrier, in accordance with an example embodiment of the disclosure. Referring to FIG. 4A, there is shown a first carrier 401, an adhesive layer 403, an interposer 405, and under-bump metal 407. The carrier 401 may comprise a support structure for handling of the interposer 405, such as when forming the under-bump metal 407 on the interposer 405.

The interposer 405 may, for example, comprise a wafer of individual interposer die, and may be coupled to the first carrier 401 using the adhesive layer 403. The first carrier 401 may be utilized to support the interposer 405 while forming the under-bump metal 407 and other backside processing steps.

FIG. 4B illustrates the attachment of a second carrier 409 to the under-bump metal 407 (UBM) utilizing the film adhesive 411, which may comprise a thin sheet of adhesive material that may bond to the under-bump metal 407 without enveloping them, nor filling the voids between UBMs. Thus, the removal of the film adhesive 411 may be easier than conventional adhesive layers so that lower cost slide-off methods may be utilized. In an another example scenario, the under-bump metal 407 may be partially or wholly embedded in the film adhesive 411 as opposed to be fully outside the film adhesive 411, as shown in FIG. 4B In addition, subsequent processing with the thick interposer wafer may provide good planarity for bonding of die, particularly with larger devices.

FIG. 4C illustrates the removal of the first carrier 401 utilizing the tape carrier 413, which may provide a temporary lateral support structure for handling the interposer 405 during a "slide-off" process for removing the first carrier 401. The second carrier 409, the film adhesive 411, the under-bump metal 407, and the interposer 405 may then be de-taped, i.e. removed from the tape carrier 413, resulting in the structure shown in FIG. 4D.

The interposer 405 may then be processed for the bonding of the semiconductor die 415. This may comprise forming conductive bumps, such as the conductive bumps 203 shown in FIG. 2. In another example scenario, the conductive bumps may already be formed on the interposer 405, to which the semiconductor die 415 may be bonded, as shown in FIG. 4E.

The semiconductor die 415 may be bonded to the interposer 405 utilizing a mass reflow process, for example, and may also utilize a capillary underfill material to fill the void between the die and the interposer.

Because the film adhesive 411 does not envelop the under-bump metal 407 as conventional adhesives do, the mass reflow process may be utilized to bond the semiconductor die 415 to the interposer 405 as opposed to a thermal compression process, for example.

The semiconductor die 415 and the top of the interposer 405 may then be encapsulated by an encapsulant 417, which may comprise an epoxy-based material, for example, that provides electrical isolation and mechanical protection from external stresses and conditions. The encapsulant 417 may cover the top surface of the semiconductor die 415, or may be ground down to expose the top surface of the die 415. The structure in FIG. 4F illustrates encapsulant material slightly covering the top surface of the semiconductor die 415.

Figures 4F, 4G, 4H, 4I, 4J, 4K:
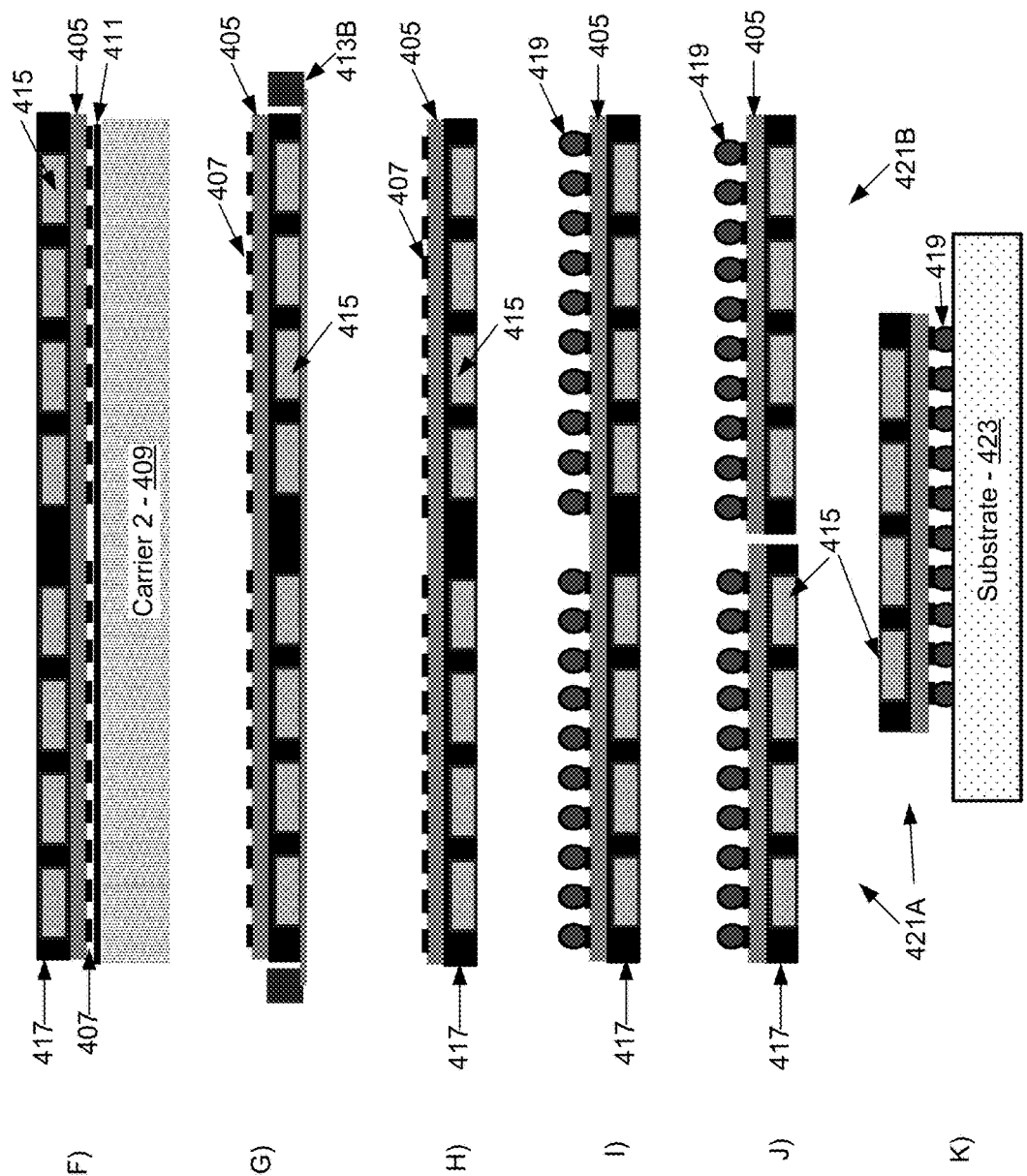

The second carrier 409 may then be removed utilizing a slide-off process using the tape carrier 413B, which may stabilize the interposer 405 while removing the second carrier 409 and the film adhesive 411, resulting in the structure shown in FIG. 4H following the removal of the tape carrier 413B.

Conductive bumps 419 may then be formed on the under-bump metal 407, resulting in the structure shown in FIG. 4I. In an example scenario, the conductive bumps 419 may comprise C4 solder balls. By forming the conductive bumps 419 at this stage, as opposed to earlier in the process, as shown by the forming of the conductive bumps 307 in the first stage illustrated in FIG. 3A, height variations may be minimized, improving planarity during processing of the interposer 405.

The interposer 405 with semiconductor die 415 and encapsulant 417 may then be singulated into a plurality of packaged die structures, or die and interposer structures 421A and 421B as shown in FIG. 4J. The singulation may proceed by a mechanical sawing process, for example, where each singulated package may then be bonded to a substrate 423, as illustrated in FIG. 4K. The conductive bumps 419 may be electrically coupled to contact pads on the substrate utilizing a mass reflow process, for example. Accordingly, a capillary underfill may be used to fill the void between the interposer 405 and the substrate 423.

In another example scenario, the encapsulation process shown in FIG. 4F may be skipped, with the structure processed similarly to the final step shown in FIG. 4K, but without encapsulant. The resulting structure may then be encapsulated, if desired, following electrical testing of the interconnections made and the function on the semiconductor die 415. In this manner, the structure may be tested prior to encapsulation, which may be particularly useful when higher cost die are utilized. In yet another example scenario, the mold process may be eliminated completely, resulting in a no-mold structure.

Figures 5A, 5B, 5C, 5D, 5E:
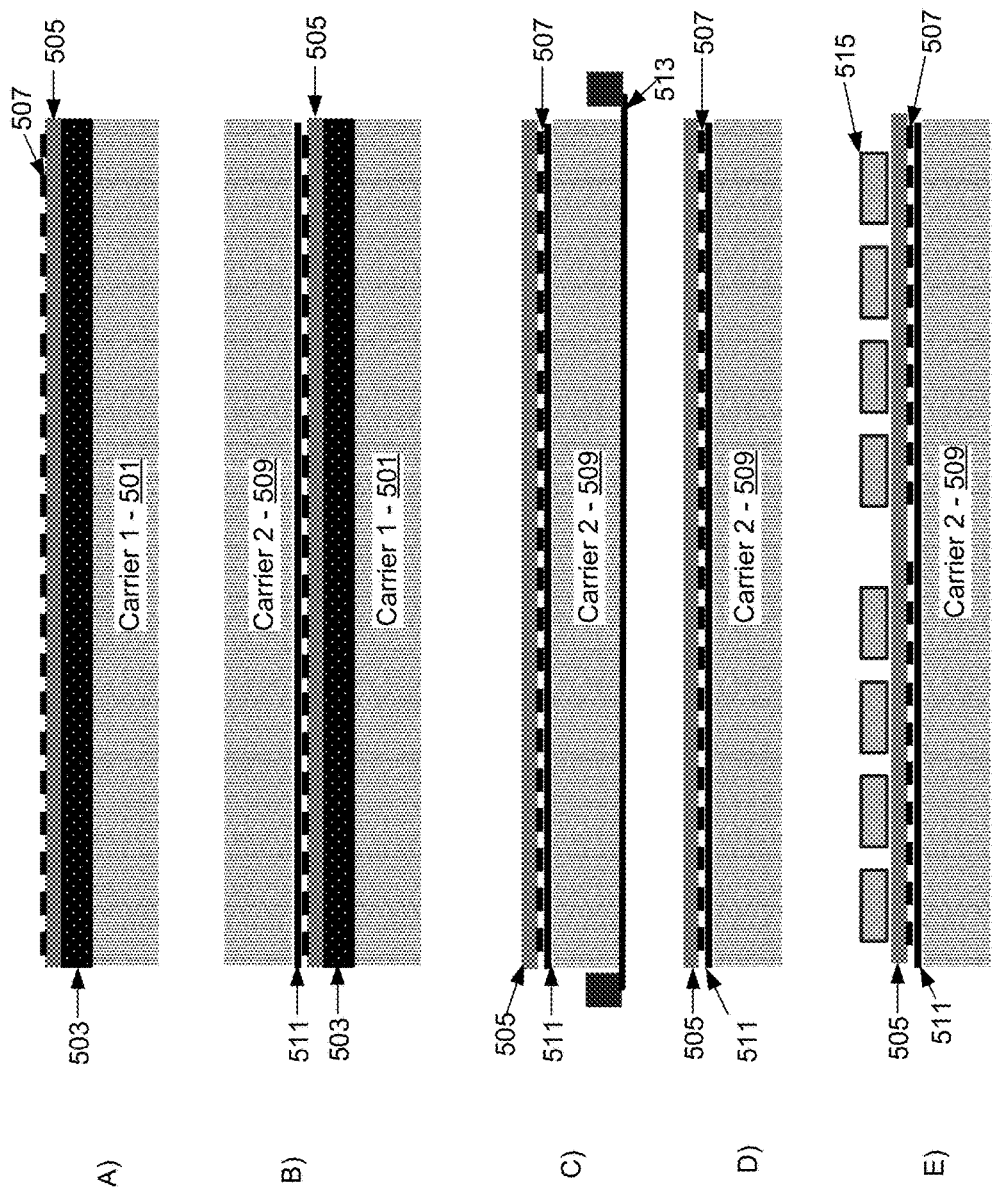
FIG. 5A-5K illustrate interposer wafer processing with a film adhesive attached carrier and substrate with solder balls, in accordance with an example embodiment of the disclosure.

FIGS. 5A-5K illustrate interposer wafer processing with a film adhesive attached carrier and substrate with solder balls, in accordance with an example embodiment of the disclosure. Referring to FIG. 5A, there is shown a first carrier 501, an adhesive layer 503, and an interposer 505 with under-bump metal 507. The carrier 501 may comprise a support structure for handling the interposer 505, such as when forming the under-bump metal 507 on the interposer 505.

The interposer 505 may comprise a wafer of individual interposer die, and may be coupled to the first carrier 501 using the adhesive layer 503. The first carrier 501 may be utilized to support the interposer 505 while forming the under-bump metal 507 and other backside processing steps.

FIG. 5B illustrates the attachment of a second carrier 509 to the under-bump metal 507 utilizing the film adhesive 511, which may comprise a thin sheet of adhesive material that may bond to the under-bump metal 507 without enveloping them, nor filling the voids between the metal features in the under-bump metal 507. Thus, the removal of the film adhesive 511 may be easier than conventional adhesive layers so that lower cost slide-off methods may be utilized. In an another example scenario, the under-bump metal 507 may be partially or wholly embedded in the film adhesive 511 as opposed to be fully outside the film adhesive 511, as shown in FIG. 5B In addition, subsequent processing with the thick interposer wafer may provide good planarity for bonding of die, particularly with larger devices.

FIG. 5C illustrates the removal of the first carrier 501 utilizing the tape carrier 513, which may provide a temporary lateral support structure for handling the interposer 505 during a "slide-off" process for removing the first carrier 501. The second carrier 509, the film adhesive 511, the under-bump metal 507, and the interposer 505 may then be de-taped, i.e. removed from the tape carrier 513, resulting in the structure shown in FIG. 5D.

The interposer 505 may then be processed for the bonding of the semiconductor die 515. This may comprise forming conductive bumps, such as the conductive bumps 203 shown in FIG. 2. In another example scenario, the conductive bumps may already be formed on the interposer 505, to which the semiconductor die 515 may be bonded, as shown in FIG. 5E.

The semiconductor die 515 may be bonded to the interposer 505 utilizing a mass reflow process, for example, and may also utilize a capillary underfill material to fill the void between the die and the interposer.

Because the film adhesive 511 does not envelop the under-bump metal 507 as conventional adhesives do, the mass reflow process may be utilized to bond the semiconductor die 515 to the interposer 505 as opposed to a thermal compression process, for example.

The semiconductor die 515 and the top of the interposer 505 may then be encapsulated by an encapsulant 517, which may comprise an epoxy-based material, for example, that provides electrical isolation and mechanical protection from external stresses and conditions. The encapsulant 517 may cover the top surface of the semiconductor die 515, or may be ground down to expose the top surface of the die. The structure in FIG. 5F illustrates encapsulant material slightly covering the top surface of the semiconductor die 515.

Figures 5F, 5G, 5H, 5I, 5J, 5K:
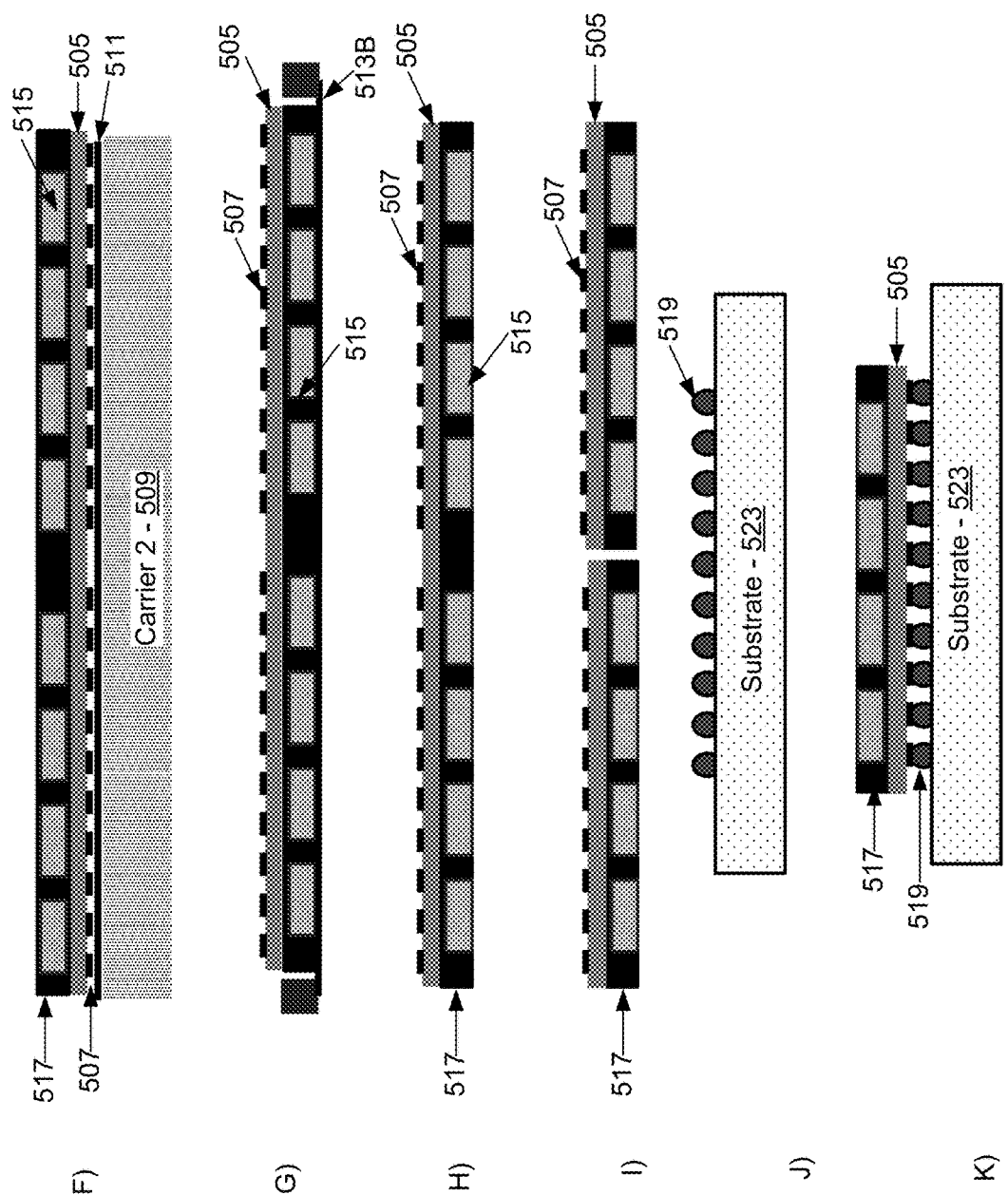

The second carrier 509 may then be removed utilizing a slide-off process using the tape carrier 513B, which may stabilize the interposer 505 while removing the second carrier 509 and the film adhesive 511, resulting in the structure shown in FIG. 5H following the removal of the tape carrier 513B.

The interposer 505 with semiconductor die 515 and encapsulant 517 may then be singulated into a plurality of die/interposer packages, as shown in FIG. 5I. The singulation may proceed by a mechanical sawing process, for example, where each singulated package may then be bonded to a substrate 523 comprising conductive bumps 519, as illustrated in FIGS. 5J and 5K. In an example scenario, the conductive bumps 519 may comprise C4 solder balls, and may be electrically coupled to the under-bump metal 507 utilizing a mass reflow process, for example. Accordingly, a capillary underfill may be used to fill the void between the interposer 505 and the substrate 523.

By forming the conductive bumps 519 on the substrate 523, as opposed to on the interposer earlier in the process, as shown by the forming of the conductive bumps 307 in the first stage illustrated in FIG. 3A, height variations may be minimized, improving planarity during processing of the interposer 505.

In another example scenario, the encapsulation process shown in FIG. 5F may be skipped, with the structure processed similarly to the final step shown in FIG. 5K, but without encapsulant. The resulting structure may then be encapsulated, if desired, following electrical testing of the interconnections made and the function on the semiconductor die 515. In this manner, the structure may be tested prior to encapsulation, which may be particularly useful when higher cost die are utilized. In yet another example scenario, the mold process may be eliminated completely, resulting in a no-mold structure.

Figure 6:
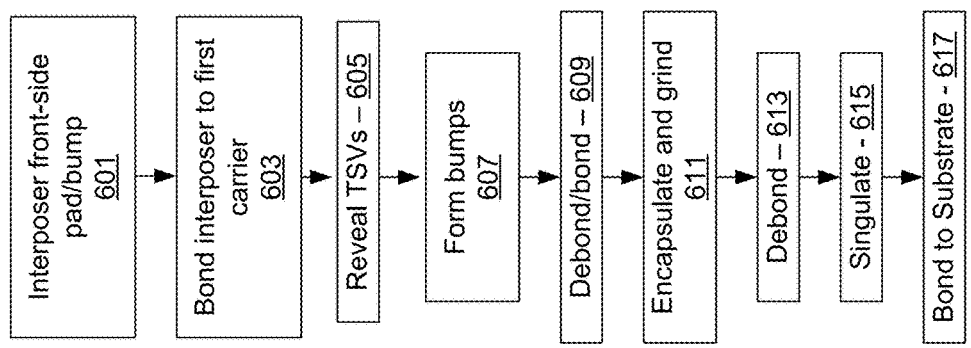
FIG. 6 is a flow chart illustrating an interposer wafer process with a film adhesive attached carrier, in accordance with an example embodiment of the disclosure.

FIG. 6 is a flow chart illustrating an interposer wafer process with a film adhesive attached carrier, in accordance with an example embodiment of the disclosure. The process described in FIG. 6 may correspond to the process described with respect to FIGS. 2 and 3, for example. In the first step 601, the interposer wafer front side may be processed, forming front-side pads and/or conductive bumps.

In step 603, the front side of the interposer wafer may be bonded to a first carrier for handling while processing the back side, followed by step 605 where the TSVs in the interposer wafer may be revealed by grinding, polishing, and/or etching the back side.

In step 607, conductive bumps, such as C4 bumps, for example, may be formed on the exposed TSVs, followed by step 609 where the interposer may be debonded from the first carrier and a second carrier with a film adhesive may be bonded to the back side. In addition, one or more semiconductor die may then be bonded to the exposed conductive bumps formed in step 609. In an example scenario, the die may be bonded to the bumps on the interposer utilizing a mass reflow with capillary underfill process.

In step 611, the die and exposed surface of the interposer may be encapsulated with an encapsulant material, which may then be ground back to thin the encapsulant on top of the die, or remove completely in this region. In yet another example scenario, the step 611 may be eliminated completely, resulting in a no-mold structure. In step 613, the second carrier may be debonded, and in step 615 the resulting structure may be singulated into a plurality of encapsulated die/interposer structures. Finally, the singulated structure may be bonded to a substrate in step 617.

Figure 7:
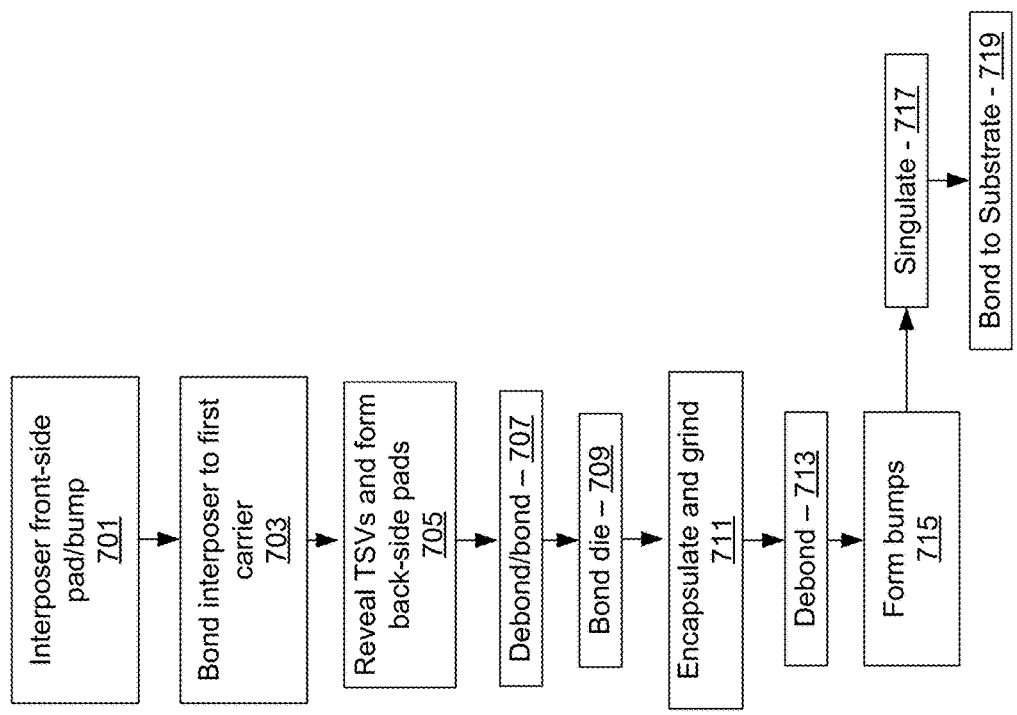
FIG. 7 is a flow chart illustrating an alternative interposer wafer process with a film adhesive attached carrier, in accordance with an example embodiment of the disclosure.

FIG. 7 is a flow chart illustrating an alternative interposer wafer process with a film adhesive attached carrier, in accordance with an example embodiment of the disclosure. The process described in FIG. 7 may correspond to the process described with respect to FIG. 4, for example. In the first step 701, the interposer wafer front side may be processed, forming front-side pads and/or conductive bumps.

In step 703, the front side of the interposer wafer may be bonded to a first carrier for handling while processing the back side, followed by step 705 where the TSVs in the interposer wafer may be revealed by grinding, polishing, and/or etching the back side. In addition, back-side pads may be formed on the interposer for later formed conductive bumps.

In step 707, the interposer may be debonded from the first carrier and a second carrier with a film adhesive may be bonded to the back side. One or more semiconductor die may then be bonded to the exposed conductive bumps formed in step 701. In an example scenario, the die may be bonded to the bumps on the interposer utilizing a mass reflow with capillary underfill process.

In step 711, the die and exposed surface of the interposer may be encapsulated with an encapsulant material, which may then be ground back to thin the encapsulant on top of the die, or remove completely in this region. In yet another example scenario, the step 711 may be eliminated completely, resulting in a no-mold structure. In step 713, the second carrier may be debonded, and in step 715 bumps may be formed on the surface exposed by the removal of the second carrier.

The resulting structure may be singulated into a plurality of encapsulated die/interposer structures in step 717. Finally, the singulated structure may be bonded to a substrate in step 719.

Figure 8:
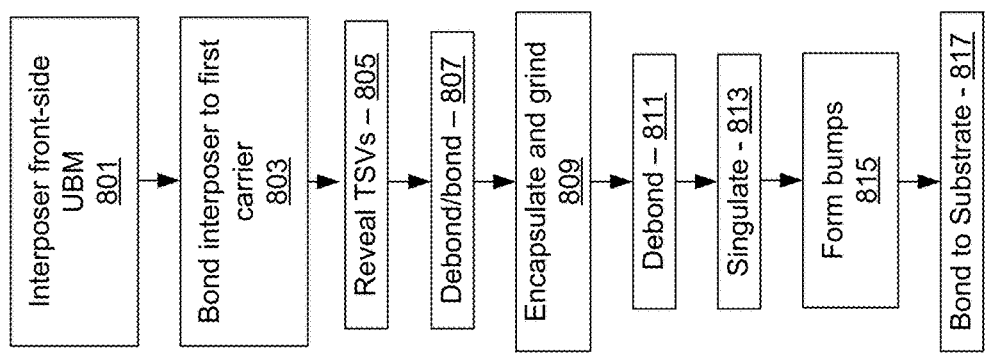
FIG. 8 is a flow chart illustrating another alternative interposer wafer process with a film adhesive attached carrier, in accordance with an example embodiment of the disclosure.

FIG. 8 is a flow chart illustrating another alternative interposer wafer process with a film adhesive attached carrier, in accordance with an example embodiment of the disclosure. In the first step 801, the interposer wafer front side may be processed, forming front-side under-bump metal.

In step 803, the front side of the interposer wafer may be bonded to a first carrier for handling while processing the back side, followed by step 805 where the TSVs in the interposer wafer may be revealed by grinding, polishing, and/or etching the back side.

In step 807, the interposer may be debonded from the first carrier and a second carrier with a film adhesive may be bonded to the back side. In addition, one or more semiconductor die may then be bonded to the conductive pads on the front side. In an example scenario, the die may be bonded to the interposer utilizing a mass reflow with capillary underfill process.

In step 809, the die and exposed surface of the interposer may be encapsulated with an encapsulant material, which may then be ground back to thin the encapsulant on top of the die, or remove completely in this region. In yet another example scenario, the step 809 may be eliminated completely, resulting in a no-mold structure. In step 811, the second carrier may be debonded, and in step 813, the resulting structure may be singulated into a plurality of encapsulated die/interposer structures. In step 815, conductive bumps may be formed on a substrate followed by step 817 where the singulated structure may be bonded to the substrate conductive bumps. In an example scenario, the conductive bumps on the substrate may comprise C4 solder balls, and may be electrically coupled to the under-bump metal formed in step 801 utilizing a mass reflow process, for example. Accordingly, a capillary underfill may be used to fill the void between the interposer and the substrate.

In an embodiment of the disclosure, a method and system are disclosed for a semiconductor device package formed in a chip-on-wafer last process using thin film adhesives. In this regard, aspects of the disclosure may comprise bonding a first carrier to a first surface of an interposer in wafer form, forming conductive bumps on a second surface of the interposer, bonding a second carrier to the conductive bumps utilizing a film adhesive, removing the first carrier from the interposer, bonding one or more semiconductor die to the first surface of the interposer, and encapsulating the one or more semiconductor die and the first surface of the interposer in an encapsulant material.

The second carrier and the film adhesive may be removed from the conductive bumps utilizing a slide-off process. The interposer and encapsulant may be diced into a plurality of interposer and die structures. One of the plurality of die and interposer structures may be bonded to a substrate. The one or more semiconductor die may be bonded to the interposer utilizing a mass reflow process. A capillary underfill material may be utilized in the mass reflow process. The one of the plurality of die and interposer structures may be bonded to the substrate utilizing the conductive bumps formed on the second surface of the interposer.

The one of the plurality of die and interposer structures may be bonded to the substrate utilizing a mass reflow process on the conductive bumps formed on the second surface of the interposer. Through-silicon-vias (TSVs) may be exposed at the second surface of the interposer before forming the conductive bumps on the second surface of the interposer. The encapsulant material may be ground down to expose a surface of the one or more semiconductor die. The conductive bumps may comprise copper and the encapsulant material may comprise a polymer.

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A method of manufacturing a semiconductor package, the method comprising:
   receiving an interposer on a support structure, the interposer comprising an interposer back side that comprises a plurality of interposer back side interconnection structures;
   attaching a back side carrier to the interposer back side;
   removing the support structure from the interposer;
   attaching a semiconductor die to a front side of the interposer;
   encapsulating at least a portion of the interposer and at least a portion of the semiconductor die in an encapsulating material; and
   attaching a front side carrier to the encapsulating material and removing the back side carrier.

2. The method of claim 1, wherein said attaching the back side carrier to the interposer back side comprises utilizing an adhesive layer to bond the back side carrier to the interposer back side.

3. The method of claim 2, wherein each of the interposer back side interconnection structures comprises an under-bump metal that is at least partially embedded in the adhesive layer.

4. The method of claim 1, wherein said removing the support structure from the interposer comprises separating the support structure from the interposer.

5. The method of claim 1, comprising forming conductive columns electrically connected to the front side of the interposer and at least as tall as the thickness of the interposer.

6. The method of claim 5, comprising grinding the conductive columns.

7. The method of claim 1, comprising, before said encapsulating, underfilling between the semiconductor dies and the interposer.

8. The method of claim 1, wherein said encapsulating comprises encapsulating a top side of the semiconductor die.

9. The method of claim 8, wherein said encapsulating comprises grinding a top side of the encapsulating material without exposing a top side of the semiconductor die.

10. The method of claim 1, comprising after said encapsulating, singulating the interposer from a wafer comprising the interposer and at least another interposer.

11. A method of manufacturing a semiconductor packaging, the method comprising:
    receiving an interposer on a support structure, the interposer comprising an interposer back side that comprises a plurality of interposer back side interconnection structures;
    attaching a back side carrier to the interposer back side;
    removing the support structure from the interposer;
    forming interposer front side interconnection structures on a front side of the interposer;
    attaching a plurality of semiconductor dies to the interposer front side interconnection structures;
    encapsulating at least the front side of the interposer and lateral sides of the semiconductor dies in an encapsulating material;
    removing the back side carrier; and
    forming conductive balls on the interposer back side interconnection structures.

12. The method of claim 11, wherein said interposer on a support structure comprises an intervening layer between the interposer and the support structure.

13. The method of claim 12, wherein the intervening layer comprises an adhesive layer.

14. The method of claim 12, comprising after said attaching the back side carrier to the interposer back side, removing both the support structure and the intervening layer from the interposer.

15. A method of manufacturing a semiconductor package, the method comprising:
    receiving an interposer on a support structure, the interposer comprising an interposer front side that comprises a plurality of interposer front side interconnection structures;
    attaching a first front side carrier to the interposer front side;
    removing the support structure from the interposer;
    forming interposer back side interconnection structures on a back side of the interposer;
    attaching a back side carrier to the interposer back side and removing the first front side carrier from the interposer front side;
    attaching a plurality of semiconductor dies to the interposer front side interconnection structures; and encapsulating at least the front side of the interposer and lateral sides of the semiconductor dies in an encapsulating material.

16. The method of claim 15, comprising after said encapsulating, forming conductive balls on a bottom side of the package.

17. The method of claim 15, comprising after said encapsulating, singulating the interposer from a wafer comprising the interposer and at least another interposer.

18. The method of claim 15, comprising prior to said encapsulating, forming an underfill between the attached plurality of semiconductor dies and the interposer.

19. The method of claim 15, wherein said removing the support structure from the interposer comprises thinning the support structure.

20. The method of claim 19, wherein the support structure comprises silicon, and said thinning the support structure comprises grinding the support structure from the interposer to expose the interposer back side.

* * * * *